(12) United States Patent
Kuenzler et al.

(10) Patent No.: US 6,446,783 B1
(45) Date of Patent: Sep. 10, 2002

(54) ELECTRODE TIP LOADING METHOD AND APPARATUS

(75) Inventors: Glenn Kuenzler; Martin N. Hassink, both of Macedonia, OH (US)

(73) Assignee: General Electric Company, Schenectady, NY (US)

( * ) Notice: Subject to any disclaimer, the term of this patent is extended or adjusted under 35 U.S.C. 154(b) by 0 days.

(21) Appl. No.: 09/607,648

(22) Filed: Jun. 30, 2000

(51) Int. Cl.⁷ .............................................. B65G 17/32
(52) U.S. Cl. ................ 198/393; 198/459.1; 198/459.2; 198/580; 198/954; 221/159
(58) Field of Search .......................... 198/393, 459.1, 198/459.2, 580, 954; 221/159

(56) References Cited

U.S. PATENT DOCUMENTS

| | | | | |
|---|---|---|---|---|
| 3,318,434 A | * | 5/1967 | Waller | 198/33 |
| 3,490,575 A | * | 1/1970 | Herrmann | 198/33 |
| 4,079,829 A | * | 3/1978 | Belysev | 198/345 |
| 4,335,810 A | * | 6/1982 | Ackley | 198/380 |
| 4,496,041 A | * | 1/1985 | Voillot | 198/457 |
| 4,548,287 A | * | 10/1985 | Matsuura | 177/25 |
| 4,673,077 A | * | 6/1987 | Taniguchi | 198/393 |
| 4,687,093 A | * | 8/1987 | Marshall et al. | 198/465.2 |
| 4,721,228 A | | 1/1988 | Bejerano | 221/13 |
| 4,723,661 A | * | 2/1988 | Hoppmann et al. | 209/658 |
| 4,830,172 A | * | 5/1989 | Hilton et al. | 198/392 |
| 5,038,914 A | * | 8/1991 | Cotic et al. | 198/393 |
| 5,283,950 A | * | 2/1994 | Fischer | 29/884 |
| 5,392,954 A | * | 2/1995 | Gartz | 221/165 |
| 5,740,902 A | * | 4/1998 | Spatfora | 198/459.2 |
| 5,836,437 A | * | 11/1998 | Saito et al. | 198/396 |
| 5,857,587 A | * | 1/1999 | Ota | 221/242 |
| 6,220,812 B1 | * | 4/2001 | Bordignon et al. | 414/745.7 |
| 6,276,514 B1 | * | 8/2001 | Cochin | 198/459.2 |

FOREIGN PATENT DOCUMENTS

| | | |
|---|---|---|
| EP | 166 163 A1 | 5/1985 |
| EP | 0 429 669 A1 | 12/1990 |
| EP | 0524 898 A1 | 1/1993 |
| EP | 0952 099 A2 | 10/1999 |
| GB | 2 351 281 A | 12/2000 |

\* cited by examiner

*Primary Examiner*—Christopher P. Ellis
*Assistant Examiner*—Rashmi Sharma
(74) *Attorney, Agent, or Firm*—Fay, Sharp, Fagan, Minnich & McKee, LLP

(57) ABSTRACT

A method and apparatus for singulating and delivering wire leads as part of an electrode welding process in lamp production. Leads in bulk form are transported by a feeder. The leads are dropped from the feeder and passively caught in a desired orientation within a rotational turret. The turret delivers the leads to an exit point. The leads are processed at the exit point by pick-and-place equipment.

16 Claims, 2 Drawing Sheets

ELECTRODE TIP LOADING METHOD AND APPARATUS

FIELD OF THE INVENTION

The present invention concerns a parts transfer method and apparatus for use in selecting a single part from a group of such parts and more particularly the invention concerns method and apparatus for selecting a single wire lead for use as a lamp electrode from a group of such parts.

BACKGROUND ART

An existing feeding device for ceramic metal-halide lamp electrodes uses a vibratory bowl feeder to funnel the individual parts onto a track At the end of the track, an escapement singlates the parts and a prior art vacuum pick-and-place unit pushes into the end of the track to pick one electrode up at a time. The existing feeding device appears to be functionally limited to parts no smaller than 0.012 inches in diameter. Attempts to use current systems with smaller diameter electrodes causes misfeeds, parts to fall onto the floor, and ultimately, prohibitive scrap and production delay expenses.

The electrode tips for a future ceramic metal-halide lamp require shank diameters approaching 0.005 inches and lengths approaching 2.5 millimeters. There is thus a need for a feeding system capable of accommodating electrodes of at least this reduced size.

SUMMARY OF THE INVENTION

The present invention addresses the need to singulate and feed small electrodes as part of a ceramic metal-halide lamp production process.

The apparatus, constructed in accordance with an exemplary embodiment of the invention, singulates and feeds lamp electrodes according to the method of the present invention includes, an electrode feeder, a fixture, a catch tray, and a drive mechanism. The electrode feeder, supplied by a bulk containment feeder, feeds lamp electrodes to a feeder exit. The fixture defines an upper surface having a generally apex shape, such upper surface having machined therein holes to catch some of the electrodes as they fall from the electrode feeder exit. A vibrating catch tray is mounted under the fixture, and has a return path to the bulk containment feeder. The driving mechanism is attached to the fixture, for delivering electrodes to a location removed from the electrode feeder exit.

The design and mass production of ceramic metal-halide lamps is currently constrained by electrode size. Any attempt to use current singulation and feeding systems with smaller diameter electrodes causes prohibitive scrap and production delay expenses. The present invention allows for high-speed mass production of ceramic metal-halide lamps with electrodes at least as small as 0.005 inches in diameter and 2.5 millimeters in length.

In one embodiment of the invention, an electrode feeder is mounted such that the feeder exit is positioned vertical from, but not in contact with, the apex shape of the fixture's upper surface. When the electrodes exit the feeder, they fall and contact the fixture's upper surface. The fixture apex may form a narrow ridge, the horizontal upper surface of which is machined with vertical holes larger than an electrode shank diameter, but smaller than an electrode coil diameter, and of a depth less than an electrode length.

The machined holes will catch falling electrodes that contact the ridge in a near vertical orientation. Once the electrode is caught, the bottom edge of the electrode coil rests against the upper fixture surface, and the electrode shank is suspended within the machined hole.

Any electrodes not caught will fall to either the inside or outside of the fixture's apex, and are gathered by a vibrating catch tray. The fixture's lower surface is machined to include internal pass-through voids to allow electrodes to fall into the catch tray. The fixture is machined and finished in such a fashion to prevent the collection of electrodes or portions of electrodes on any surface outside the apex vertical holes.

The electrodes are transported from a position where they are caught by the fixture to a location where they can be removed from the fixture. The fixture may be attached to a driving mechanism. The driving mechanism may be a motor connected to the fixture by a rotational mounting shaft.

In a second embodiment of the invention, the fixture is a ring-shaped turret. In this preferred embodiment, the turret's upper surface forms a ring-shaped narrow ridge. The lower surface of the turret is machined to include internal pass-through voids, each partially circumscribing a center point of the ring, between the ring and the center point of the turret. In this embodiment, the turret is most preferably rotationally driven by a stepper motor, providing precisely timed sequential delivery to feeder exit point.

These and other objects, advantages and features of the invention will become better understood by review of the accompanying detailed description of a preferred embodiment of the invention which is described in conjunction with the accompany drawings.

BEST MODE FOR CARRYING OUT THE INVENTION

Figure 1:
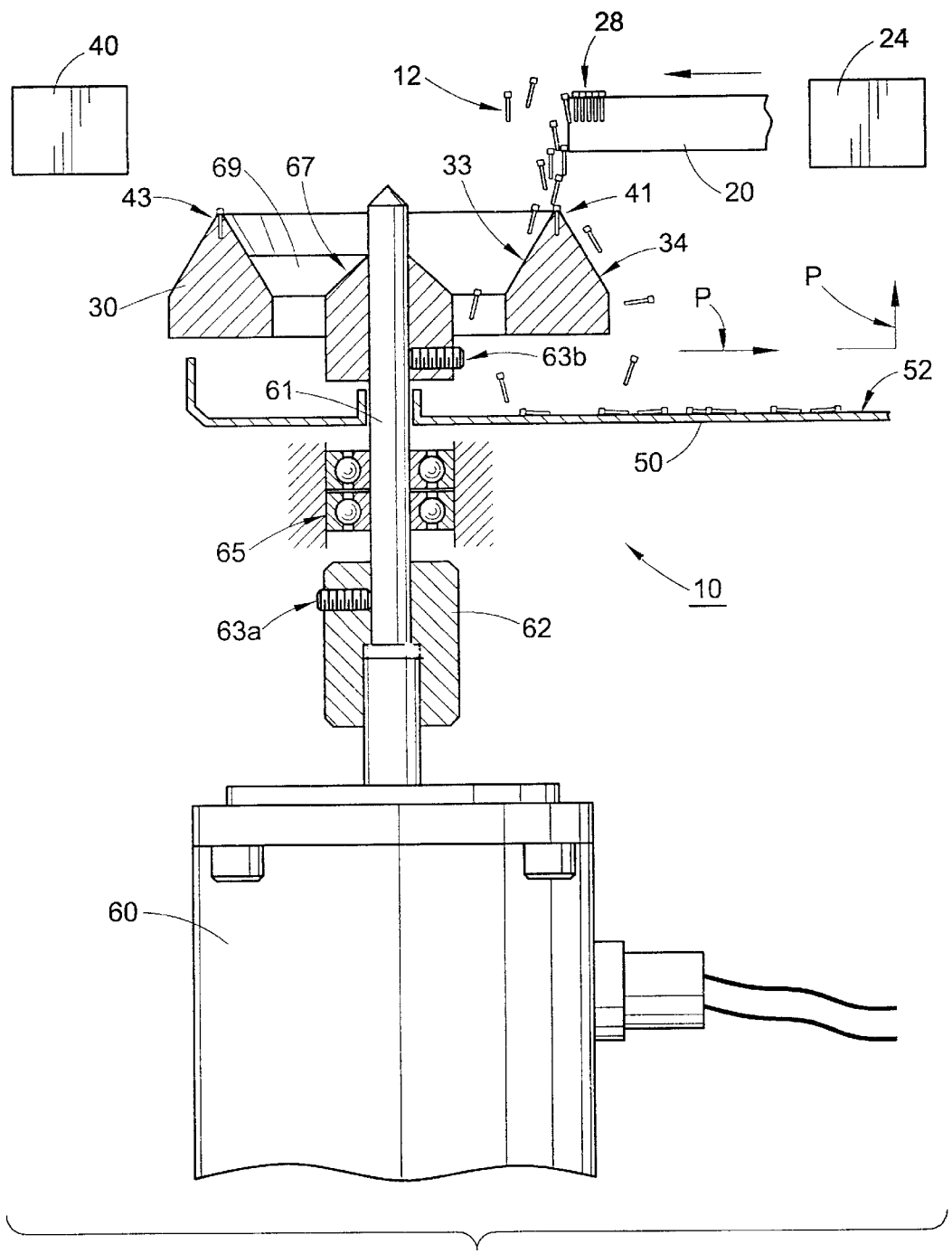
FIG. 1 is a side elevation view (partially in section) of a parts singulation and delivery system having a feeder, fixture, rotational shaft, and motor.

The disclosed exemplary embodiment of the present invention addresses the need to singulate and deliver small electrodes as part of a ceramic metal-halide lamp production process.

The system 10, constructed in accordance with an exemplary embodiment of the invention, singulates and feeds lamp electrode tips 12 and according to the method of the present invention includes, an electrode feeder 20 to a specified location, a fixture 30, a catch tray 50, and a drive mechanism 60. The electrode feeder 20, supplied by a bulk containment feeder 24, feeds lamp electrodes to a feeder exit 28. The fixture 30 having a generally apex shape, defines an upper surface 31, such upper surface having machined therein holes 32 to catch some of the electrodes as they fall from the electrode feeder exit 28. A vibrating catch tray 50 is mounted under the fixture, and has a return path indicated by the arrow P in FIG. 1 to the bulk containment feeder 24. The driving mechanism 60 is attached to the fixture, for delivering electrodes to a location 43 removed from the electrode feeder exit.

Figure 3:
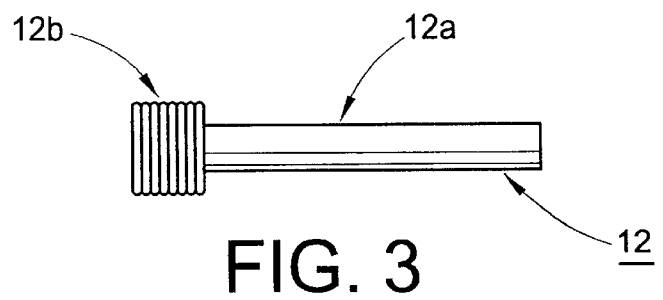
FIG. 3 is a side view of an electrode.

Referring to FIG. 3, in an exemplary embodiment, the electrode tip 12 which is used as a lamp electrode tip is constructed of metal, such as tungsten. A preferred electrode is constructed from a coil 12*b* spirally wrapped tightly around a shank 12*a*. The electrode coil pitch is near 100%.

The electrode may be at least as small in size as 0.005 inches in diameter and 2.5 millimeters in length. Electrodes are placed into a bulk containment feeder 24 for initial processing. The bulk containment feeder may be vibratory, and allows electrodes to enter an electrode feeder 20. The electrode enters the feeder and travels along a narrow linear track 26. In the preferred embodiment, the track width is less than the electrode coil diameter. The track defines a slot whose depth is greater than the electrode shank length. The bottom surface of the electrode coil 12b rests upon the top exterior surface of the linear track 26. The termination of electrode travel along the linear track 26 is the feeder exit 28. The track vibrates and is at a slight angle causing electrodes to travel toward the feeder exit. At the feeder exit 28 the electrodes are allowed to free-fall toward the fixture 30.

A fixture 30 passively "catches" some of the electrodes which fall from the feeder exit, and transports the electrodes to a pick location 43 removed from the electrode feeder exit. The apex shaped fixture 30 has an upper surface 31, forming a narrow horizontal ridge to prevent tips 12 from resting on the apex. The width of the upper surface 31 is indicated by W in FIG. 2A, and is slightly greater than a machined hole 32 diameter, but could also be equal to or less that the hole diameter. The electrode feeder is mounted such that the feeder exit 28 is positioned vertical from, but not in contact with, the fixture's upper surface 31. When the electrodes exit the feeder, they fall and contact the fixture's upper surface. The fixture's horizontal upper surface is machined with vertical holes 32. The holes are of a diameter larger than an electrode shank 12a diameter, but smaller than an electrode coil 12b diameter, and of a depth more than an electrode tip 12 length.

When electrodes contact the fixture 30, they are either caught or they are not. In the one scenario, an electrode tip 12 contacts the fixture in an orientation so that the electrode shank 12a slips into a machined hole 32. The electrode coil 12b rests upon the upper surface 31 of the fixture's apex. Referring to FIG. 2A, the design of the machined hole 32 properly orients the electrodes in a caught position 41. In an alternative scenario, an electrode is not caught, but rather contacts an inner surface 33 of the fixture. The inner surface 33 is machined to form a smooth surface, steep enough for the tips 12 to slide away from the apex. Electrodes contacting this inner surface 33 continue to fall and are caught by a catch tray 50. In a third scenario, an electrode is not caught, but rather contacts an outer surface 34 of the fixture apex. The outer surface 34 is machined to form a smooth surface, angled sufficiently for the tips 12 to slide away from the apex. Electrodes contacting the outer surface 34 continue to fall and are caught by the catch tray 50. All surfaces of the fixture 30 are adequately finished to prevent electrodes from engaging on the fixture anywhere other than in a machined hole 32.

Figure 2:
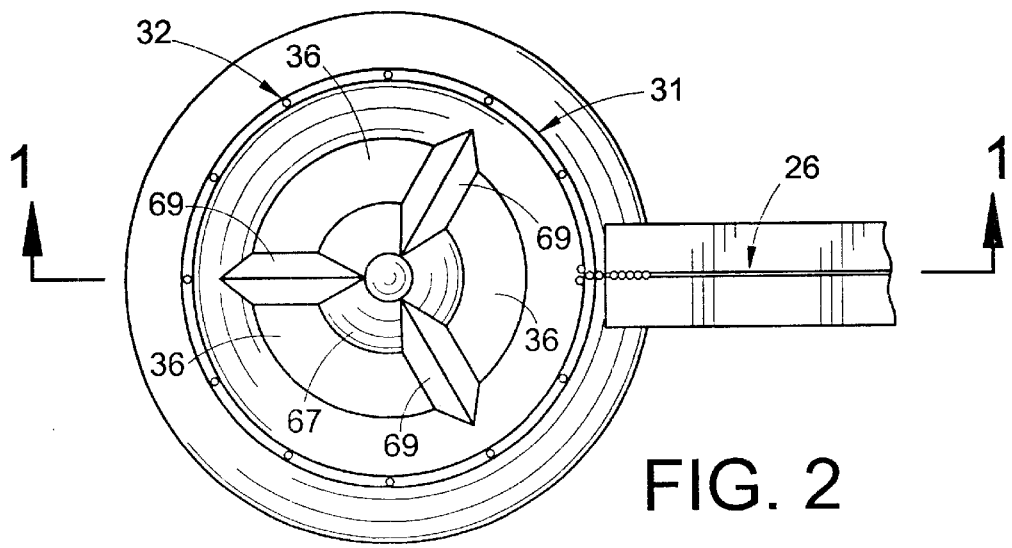
FIG. 2 is a top plan view of the FIG. 1 system.
Figure 2A:
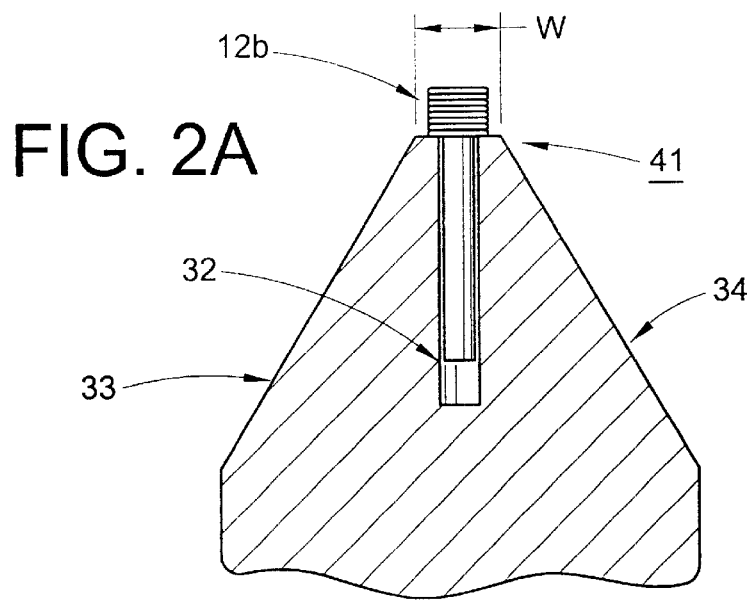
FIG. 2A is a cross-sectional view of the turret ring.

Referring to FIGS. 1 and 2, an exemplary embodiment of the invention, the fixture 30 is shown as a turret. The turret is machined from a suitable metal, resistant to wear from engagement with the tungsten tips to avoid contaminating those tips as they contact the turret. The turret has an apex shaped outer portion, forming a ring-shaped horizontal surface 31. The entire circumference of the ring surface has repetitive vertical machined holes 32, with equidistant center points. The turret's internal surface is constructed to include three internal pass-through voids 36 to allow electrodes which contact the inner surface 33 to fall and contact catch tray 50. Electrodes caught in the desired position 41 are rotationally transported along the path of the circular ring to a pick location 43. Electrodes are removed from the machined hole 32 by a pick-and-place system 40 known in the prior art.

Referring to FIG. 1, all electrodes not caught in a machined hole 32 contact a return tray 50. The return tray has a large horizontal surface area 52, sufficient to capture all electrodes contacting the inner surface 33 or outer surface 34. In one embodiment, the surface area 52 is vibrated by a mechanical source (not shown). The vibration of the tray surface 52 is isolated from the turret 30. Electrodes in contact with the surface area 52 follow a return path indicated by the arrow P in FIG. 1 to the bulk containment feeder 24.

In the preferred embodiment, the driving mechanism 60 is a motor. The motor can be a stepper motor. The stepper motor delivers a timed, continuous sequence of electrodes to a pick location 43. The stepper motor has capabilities allowing an operator to adjust timing parameters for optimum production results.

The rotational shaft 61 is primarily supported by a set of bearings 65 located beneath the catch tray 52. A set screw 63a engages the rotational shaft 61 to a flexible coupling 62, such as a flexible bellows or helical coupling. The flexible coupling 62 engages the rotational shaft 61 to the motor 60. Further, a hub 67 is engaged to the rotational shaft 61 by a set screw 63b. The hub 67 is connected to the turret 30 by a set of radially extending spokes 69. The spokes are machined from a suitable metal, resistant to wear from engagement with the tungsten tips to avoid contaminating those tips as they contact the spokes.

Although the present invention has been described with a degree of particularity, it is the intent that the invention include all modifications and alterations falling within the spirit or scope of the appended claims.

We claim:

1. An apparatus for singulating and delivering lamp electrodes for use in a lamp production process, comprising:
    a) an electrode feeder, supplied by a bulk containment feeder, for feeding lamp electrodes to a feeder exit;
    b) a fixture defining an upper surface having a generally apex shape, said upper surface having machined therein holes to catch some of the electrodes as they fall from the electrode feeder exit;
    c) a vibrating catch tray mounted under the fixture having a return path to the bulk containment feeder; and
    d) a driving mechanism, attached to the fixture for delivering electrodes to a location removed from the electrode feeder exit.

2. The apparatus of claim 1 wherein said feeder is mounted such that the feeder exit is positioned vertical from, but not in contact with, the apex shape of the fixture's upper surface.

3. The apparatus of claim 1 wherein said fixture apex forms a narrow ridge, the horizontal surface of which is machined with vertical holes larger than an electrode shank diameter, but smaller than an electrode coil diameter, and of a depth less than an electrode length.

4. The apparatus of claim 1 wherein the fixture's upper surface is a ring machined to include internal pass-through voids, each partially circumscribing a center point of the ring, between the ring and the center point of the fixture.

5. The apparatus of claim 1 wherein said fixture is machined and finished in such a fashion as to prevent the collection of electrodes or portions of electrodes on any surface outside the apex vertical holes.

6. The apparatus of claim 1 wherein said fixture is mechanically isolated from any vibration source.

7. The apparatus of claim 1 wherein said driving mechanism is a motor, said motor connected to the fixture by a rotational mounting shaft.

8. The apparatus of claim 1 wherein said electrode feeder transports metallic electrodes, along a single linear track, said track having a path width slightly smaller than the coil diameter.

9. The apparatus of claim 1 wherein said fixture is a ring-shaped turret, said turret rotationally driven by a step motor, said motor providing precisely timed sequential delivery to feeder exit point.

10. The apparatus of claim 1 wherein said electrodes are lamp tip electrodes, said tip constructed of a tungsten shank, said shank spirally wound with a tungsten wire to form a coil.

11. A method of catching elongated lamp electrodes moving along a travel path comprising the steps of:
   a) moving electrodes from a bulk source via a feeder;
   b) dropping the electrodes onto a surface of a fixture,
   c) providing holes in said surface to catch some of the electrodes depending on their orientation when they reach said surface;
   d) containing electrodes not caught within the holes in said surface, wherein said electrodes are contained by a vibrating catch tray; and
   e) moving the surface to another position to allow the electrodes caught within the holes to be individually removed from the fixture.

12. The method of claim 11 wherein the surface comprises a ring and the step of moving the surface is performed by rotating the ring so that electrodes caught as they fall onto the fixture move in a generally circular path to an electrode removal station.

13. The method of claim 11 wherein the catch tray is connected to the bulk containment feeder so that electrodes caught by the tray move in a path toward the bulk containment feeder.

14. A method of catching elongated lamp electrodes moving along a travel path comprising the steps of:
   a) moving electrodes from a bulk source via a feeder;
   b) dropping the electrodes onto a surface of a fixture;
   c) providing holes in said surface to catch some of the electrodes depending on their orientation when they reach said surface, and
   d) moving the surface to another position to allow the electrodes caught within the holes to be individually removed from the fixture;
   e) wherein the surface comprises a ring and the step of moving the surface is performed by rotating the ring so that electrodes caught as they fall onto the fixture move in a generally circular path to an electrode removal station.

15. The method of claim 14 wherein electrodes not caught as they fall onto the fixture are contained by a vibrating catch tray.

16. The method of claim 14 wherein electrodes not caught as they fall onto the fixture are contained by a vibrating catch tray, wherein said tray is connected to the bulk containment feeder so that electrodes caught by the tray move in a path toward the bulk containment feeder.

* * * * *